United States Patent [19]
Morman et al.

[11] Patent Number: 6,081,654
[45] Date of Patent: Jun. 27, 2000

[54] METHOD AND SYSTEM FOR DESIGNING A VEHICLE DOOR

[75] Inventors: Kenneth Nero Morman, West Bloomfield; David Anthony Wagner, Northville; Yuksel Gur, Ann Arbor, all of Mich.

[73] Assignee: Ford Global Technologies, Inc., Dearborn, Mich.

[21] Appl. No.: 09/082,861

[22] Filed: May 21, 1998

[51] Int. Cl.[7] .................................................. G06F 17/50
[52] U.S. Cl. .............................. 395/500.01; 395/500.28; 395/500.29
[58] Field of Search ........................... 395/500.1, 500.28, 395/500.29

[56] References Cited

U.S. PATENT DOCUMENTS

| | | | |
|---|---|---|---|
| 5,043,929 | 8/1991 | Kramer et al. | 395/500.01 |
| 5,555,406 | 9/1996 | Nozawa | 395/500.01 |
| 5,729,463 | 3/1998 | Koenig et al. | 295/500.01 |
| 5,831,875 | 11/1998 | Hirata et al. | 395/500.28 |

OTHER PUBLICATIONS

Kaplan, G. "Auto manufacture digitizes in depth," IEEE Spectrum, vol. 34, No. 11, 1997, pp. 62–69, Nov. 1997.
Costa, A.N., "Application of multibody systems techniques to vehicle modelling," IEE Coll. on Model Building Aids for Dynamic System Simulation, 1991, pp. 4/1–4/6.

Primary Examiner—Kevin J. Teska
Assistant Examiner—Kyle J. Choi
Attorney, Agent, or Firm—David B. Kelley

[57] ABSTRACT

An interactive method and system for designing a door system for an automotive vehicle without the necessity of building a prototype is disclosed. Initially, a door system design is selected and a set of door system data describing attributes of a door structure, a door opening panel (DOP), mating surfaces of the DOP and the vehicle, vehicle attributes, hardware attributes, and seal system attributes are generated based on the selected design. A door system model is then generated from the door system data, and a design criteria for the door system is selected. Door system performance is then determined using predetermined conditions based upon the door system model by computing and displaying time histories of predefined parameters of the door system, door related hardware, and vehicle passenger compartment. The door system performance is then compared to the design criteria and changes are made to the door system design by modifying the set of door system data if the door system performance does not meet the design criteria. The door system design can be changed, door performance can be determined and compared to the preselected design criteria in an iterative process until the door performance meets the design criteria.

14 Claims, 12 Drawing Sheets

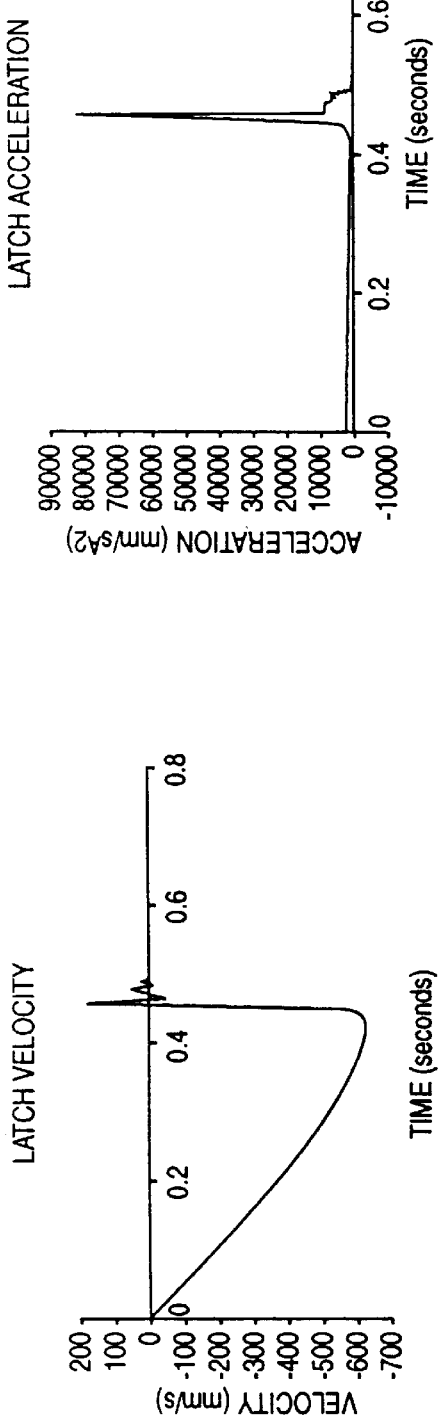
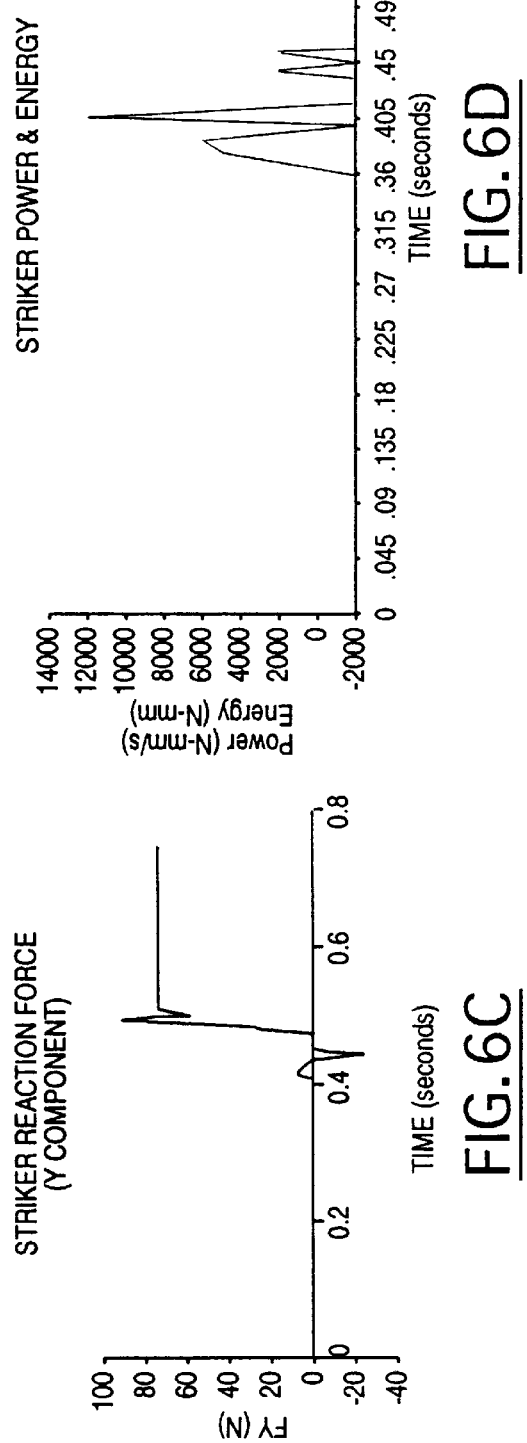

METHOD AND SYSTEM FOR DESIGNING A VEHICLE DOOR

FIELD OF THE INVENTION

The present invention relates to vehicle doors in general, and more specifically to a method and system for designing a vehicle door.

BACKGROUND OF THE INVENTION

The door system of an automotive vehicle plays a major role in a customer's perception of vehicle quality. As such, vehicle designers aspire to design robust door systems, which have desirable closing efforts, seal the passenger compartment from wind noise and water leaks, satisfy noise, vibration and harshness performance targets, and are durable. Current door system design relies heavily on "trial and error" testing and modification of physical hardware prototypes to achieve a robust design. Managing the often conflicting design goals of low closing effort, tight sealing and low wind noise frequently requires numerous iterations on prototype hardware to achieve the best possible design within the constraints of vehicle program timing and expense. The current hardware and testing based design procedure has at least two major disadvantages: first, the high cost of producing hardware prototypes; and, second, the extensive amount of time required to modify and test hardware prototypes.

SUMMARY OF THE INVENTION

In response to the deficiencies of current practice, the present invention provides an interactive method and system for designing a door system for an automotive vehicle without the necessity of building a prototype. Initially, a door system design is selected and a set of door system data describing attributes of a door structure, a door opening panel (DOP), mating surfaces of the DOP and the vehicle, vehicle attributes, hardware attributes, and seal system attributes are generated based on the selected design. A door system model is then generated from the door system data, and a design criteria for the door system is selected. Door system performance is then determined using predetermined conditions based upon the door system model by computing and displaying time histories of predefined parameters of the door system, door related hardware, and vehicle passenger compartment. The door system performance is then compared to the design criteria and changes are made to the door system design by modifying the set of door system data if the door system performance does not meet the design criteria. The door system design can be changed, door performance can be determined and compared to the preselected design criteria in an iterative process until the door performance meets the design criteria.

The method and system of the present invention can analyze the full dynamic closing of a swinging vehicle door system to determine the closing efforts, slam loads, door deflections due to aerodynamic suction, and door system natural frequencies. Many system level design questions and interactions can be investigated with the present invention for a proposed door system prior to the availability of prototype hardware. The invention can be used as a design validation tool to highlight any inadequacies prior to prototyping. Essentially, this allows "virtual prototype" testing of the door system to gather information that is not available from testing initial models which are not representative of the final door system design. The present invention includes door slam, aerodynamic deflection and door system natural frequency analyses in addition to latch test stand and door closing effort simulations. The effects of a flexible door structure, distributed masses, seal air vent damping, build variations, internal cabin pressure, aerodynamic loads and vehicle mass and suspension are all available for enhancing model fidelity.

An advantage of the present invention is a method and system for determining door system performance under testing, driving and slamming conditions prior to prototyping of a door system.

Another advantage of the present invention is a method which can improve door system quality through early analysis of the full system.

Yet another advantage of the invention is the production of critical door design information without testing physical hardware prototypes.

Still another advantage is a method and system which makes use of kinematics, statics and dynamics for creating and testing virtual door system prototypes under testing, driving and slamming conditions, to improve the quality of the door system through early analysis of the full system.

Another advantage of the present invention is a vehicle door pre-prototype analysis tool which can be used for competitive benchmark studies and for vehicle door system advanced engineering studies and development efforts.

Specific features of the present invention include the representation of vehicle door system attributes and components, without the use of hardware and without reliance on physical hardware prototypes, including but not limited to the door closing/slamming event, the dynamic resistance of the air within the passenger compartment to door closing, the flexibility and mass of the door structure, the weatherstrip seal resistance accounting for probable build variations, the dynamic resistance of the air within the weatherstrip seal bulbs, the door latch resistance, the resistance of the hinge, and the resistance of the overslam bumper.

BRIEF DESCRIPTION OF THE DRAWINGS

These and other objects, advantages, and features of the present invention will be apparent to those skilled in the art upon reading the following description with reference to the accompanying drawings, in which:

FIGS. 6A–6D are graphs showing time histories of latch velocity and acceleration, and striker reaction force and energy, respectively, which can be displayed for viewing by a user of the present invention;

DETAILED DESCRIPTION OF THE PREFERRED EMBODIMENT

Figure 1:
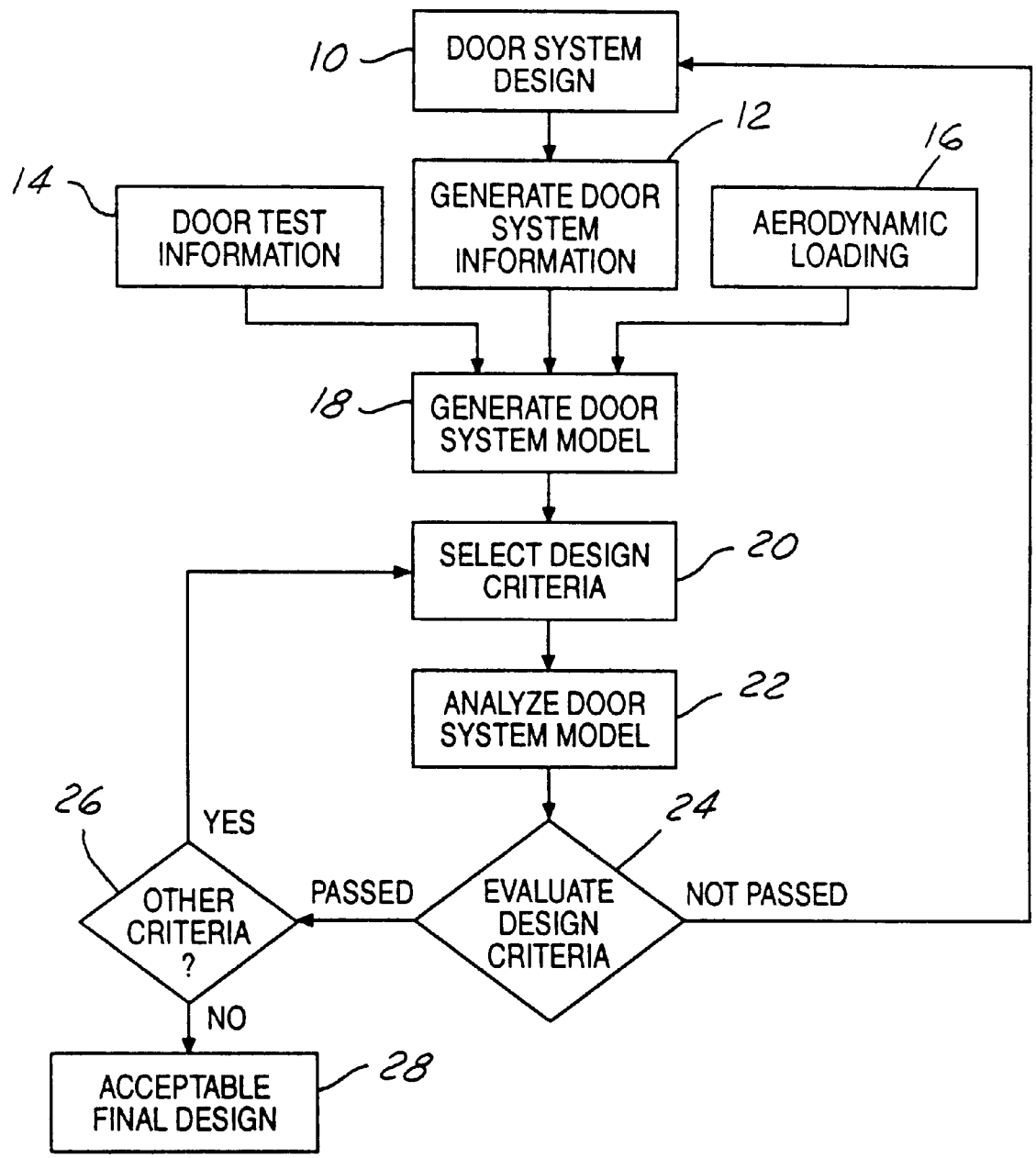
FIG. 1 is flowchart showing a preferred embodiment of a door system design method according to the present invention.
Figure 2:
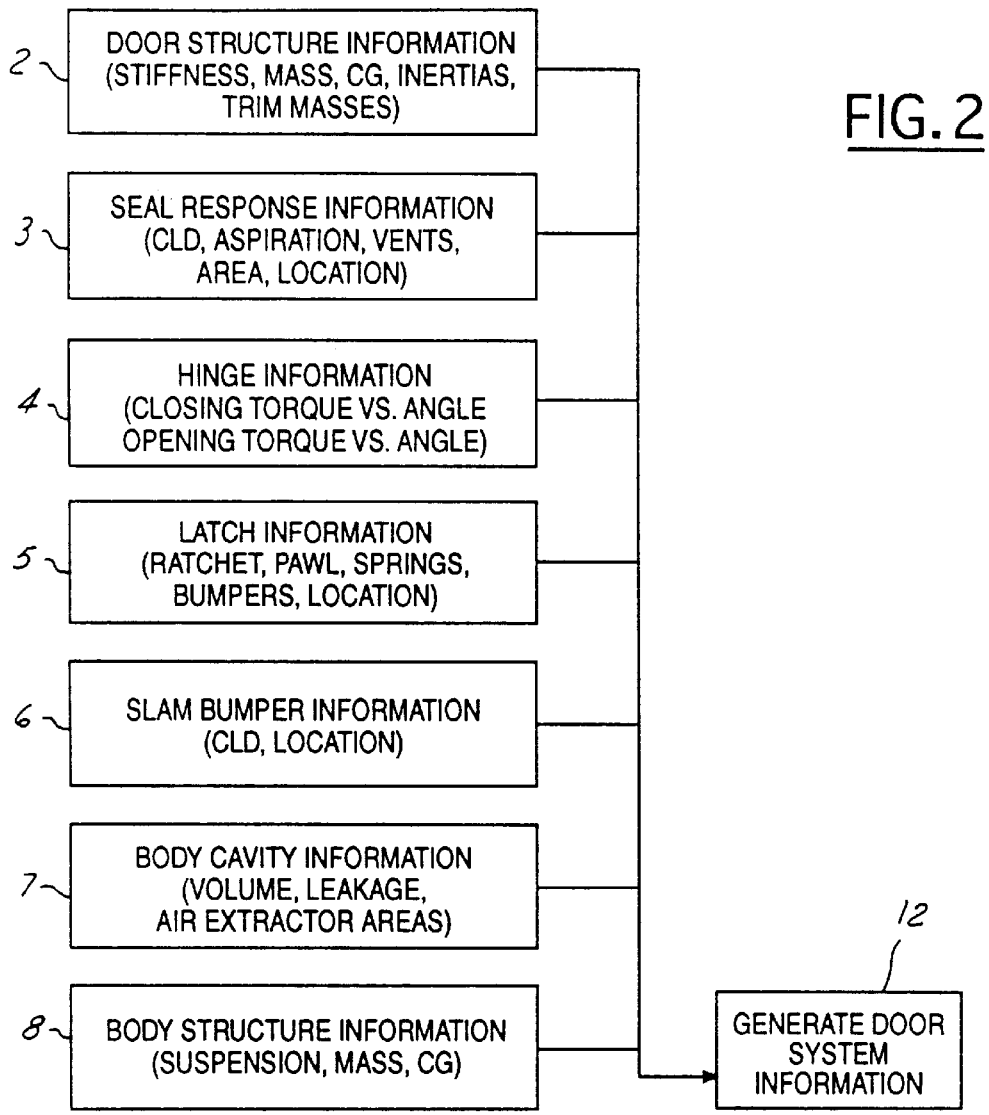
FIG. 2 is a flowchart showing assembly of door system information used to build a door system model for evaluation in the method of the present invention.

Referring now to FIG. 1, a flowchart of a preferred embodiment of the present invention is shown. In box 10, a door system design is selected from a set of preexisting designs. This set may include doors from previous model vehicles and bookshelf designs, as well as others. The door system design essentially comprises structural features, including dimensions, materials, shape and others. Next, a set of door system data is generated (box 12) which describes attributes of a door system, a door opening panel (DOP), the mating surfaces of the DOP and the vehicle, vehicle attributes, door hardware attributes, and door seal system attributes. This door system data is generated primarily from known information about the vehicle for which the door system will be designed and related components, but can also come from calculations and other determinations. As seen in FIG. 2, such door information can include door structure information (box 2), such as stiffness, mass, center of gravity, inertia, and trim mass, seal response information, such as compression load deflection (CLD), aspiration, number of vents, area, and location (box 3), and hinge information, such as closing and opening torques versus angle (box 4). Latch information is also generated, such as ratchet, pawl, spring, and bumper locations (box 5), slam bumper information, such as CLD and location (box 6), body cavity information, such as volume, leakage, and air extractor areas (box 7), and body structure information, such suspension, mass, and center of gravity (box 8). All data from boxes 2 through 8, inclusive, are potentially used to generate a door system model (box 12).

Returning to FIG. 1, door test information and door aerodynamic loading data, boxes 14 and 16, respectively, may also be used to generate a door system model in box 18. A design criteria for the door system is then selected in box 20. This criteria may include, for example, closing force and closing velocity limitations, among others. Those skilled in the art will recognize that selection of the design criteria may be made at a prior step, and is limited in sequence only to selection before the door system model is analyzed in box 22. In decision diamond 24, it is determined if the door system model meets the design criteria. If not, the method flow returns to box 10 where a new door system design is selected. If the door system model meets the design criteria, then an additional decision is made in diamond 26 whether to select additional performance criteria. If the door system model is to be analyzed against additional criteria, the flow returns to box 20 where such criteria is selected. If no further criteria is desired, then the method is complete and flow is routed to box 28.

Figure 3:
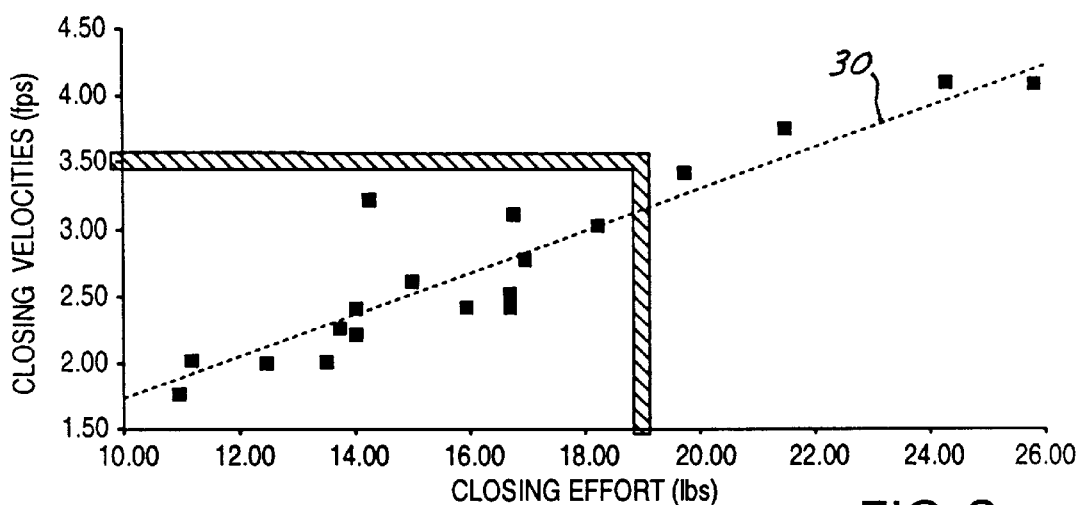
FIG. 3 is a graph showing the variation of door closing efforts for different build variations of a vehicle door.

The door system designer assembles the full model of the door system by running the analyses and programs described in FIGS. 1 and 2. The full system model is then analyzed for door closing by either a set spring load for a closing force analysis or a set initial door velocity for a closing velocity analysis. The designer gathers time history output of the selected door parameters, particularly the ratchet angle and pawl angle within the door latch. By reviewing the ratchet angle history, the designer ascertains if the latch mechanism is fully engaged. After performing repeated analyses at different spring loads and different initial velocities, the designer picks the minimum load and the minimum velocity at which the latch is fully engaged. These load and velocity values characterize the closing effort for the door system. Different values for the vehicle build variation are then selected, that is, different values for door inboard/outboard and door fore/aft, and the above described analysis is repeated to determine the variation of door closing efforts as a function of build variations. A graph 30 of such a function is shown in FIG. 3. If the full range of closing efforts for the probable build variations satisfies the design criteria, then the door design is satisfactory for closing effort. In FIG. 3, the closing effort is shown as a load less than 19.0 pounds and velocity less than 3.5 feet per second. It is believed that the build variation of greatest importance to closing effort is the door inboard/outboard position since this variability has the greatest effect on the closing resistance due to seal compression.

Latch Design

Figure 4:
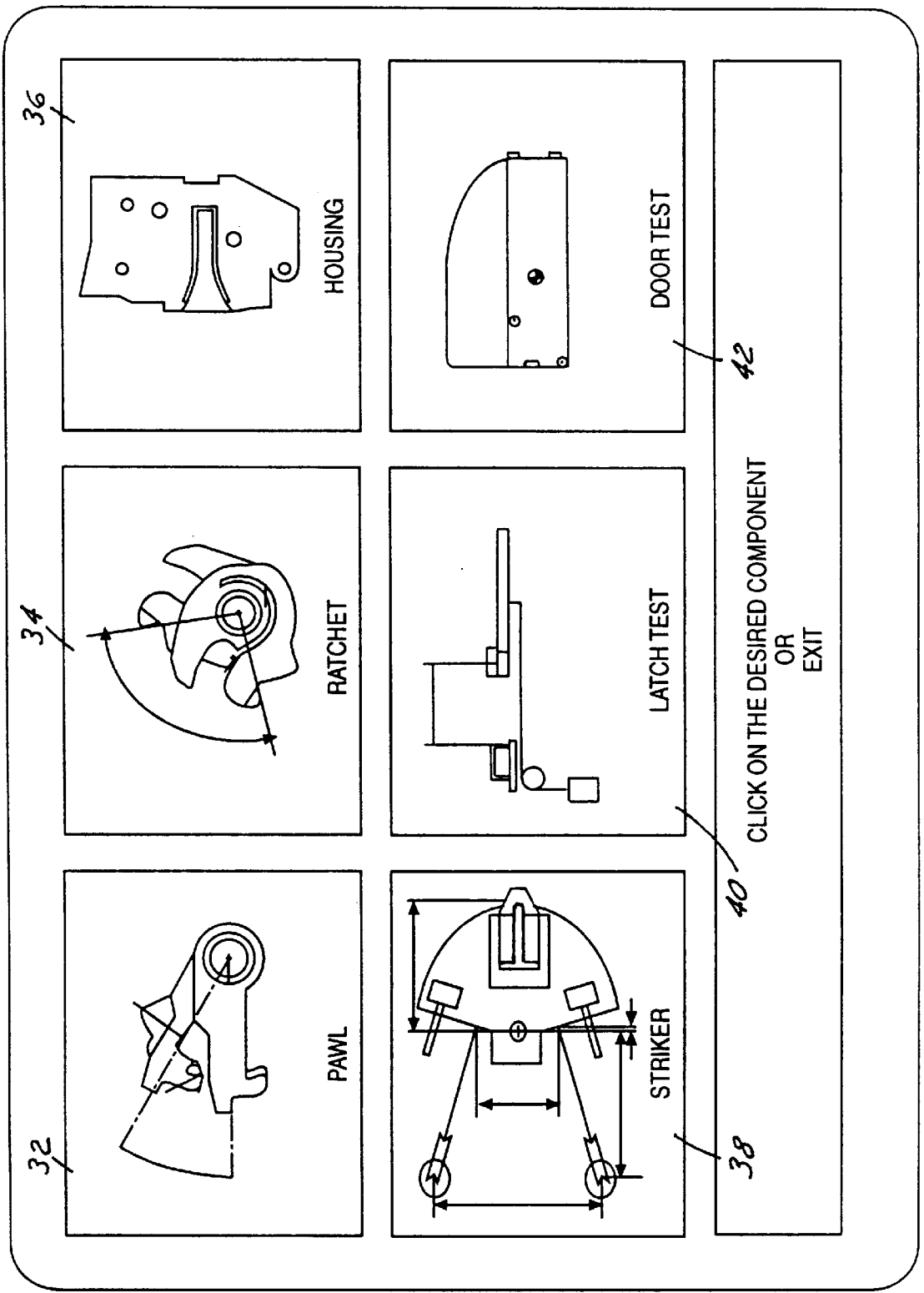
FIG. 4 is a display view of a screen showing latch components and latch tests for use with the door modeling system and method of the present invention.
Figure 5A:
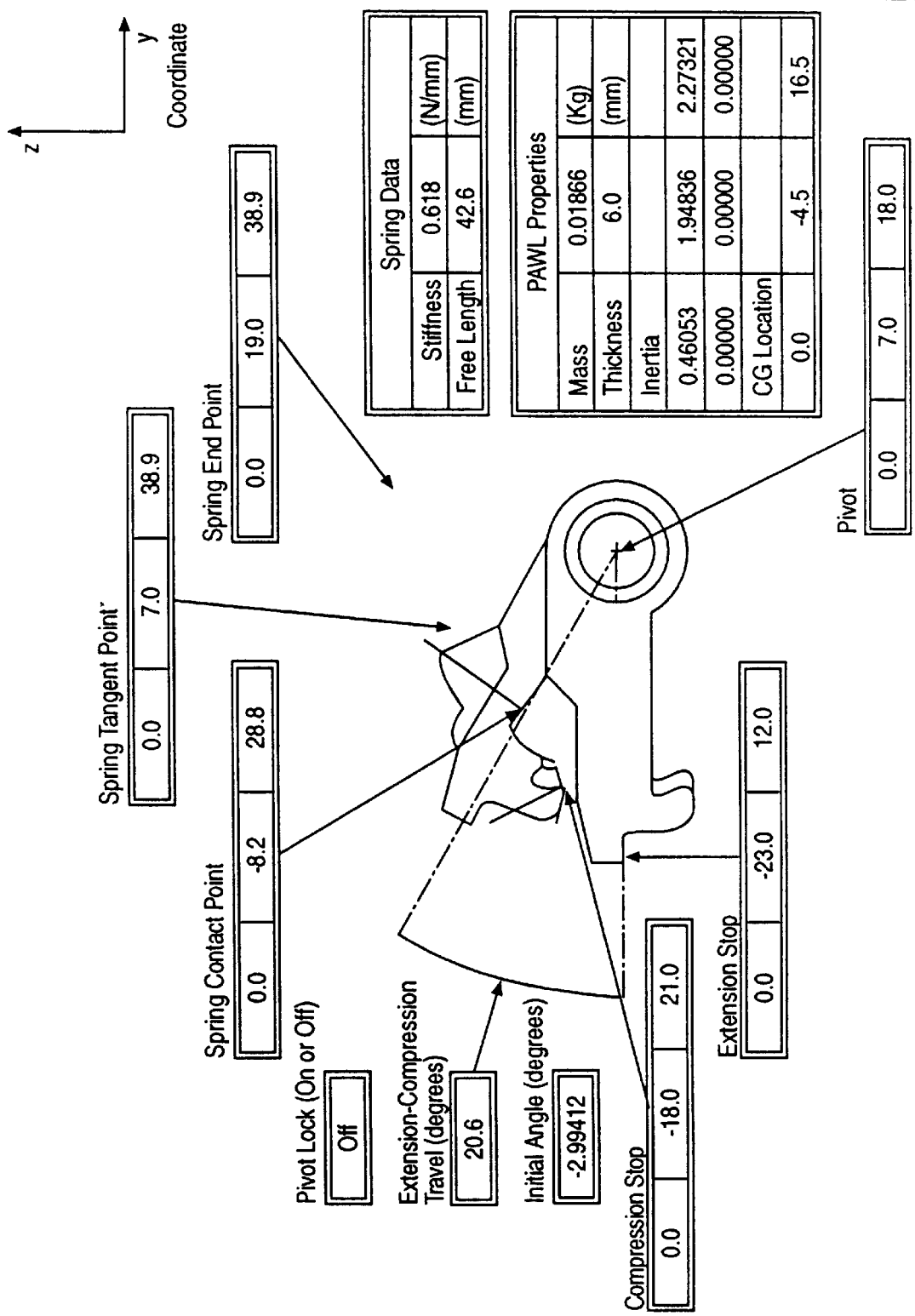
FIGS. 5A–5E are screen views of pawl, ratchet, housing, and striker components, and a door, respectively, for which various parameters may be selected by a user of the system and method of the present invention.
Figure 5B:
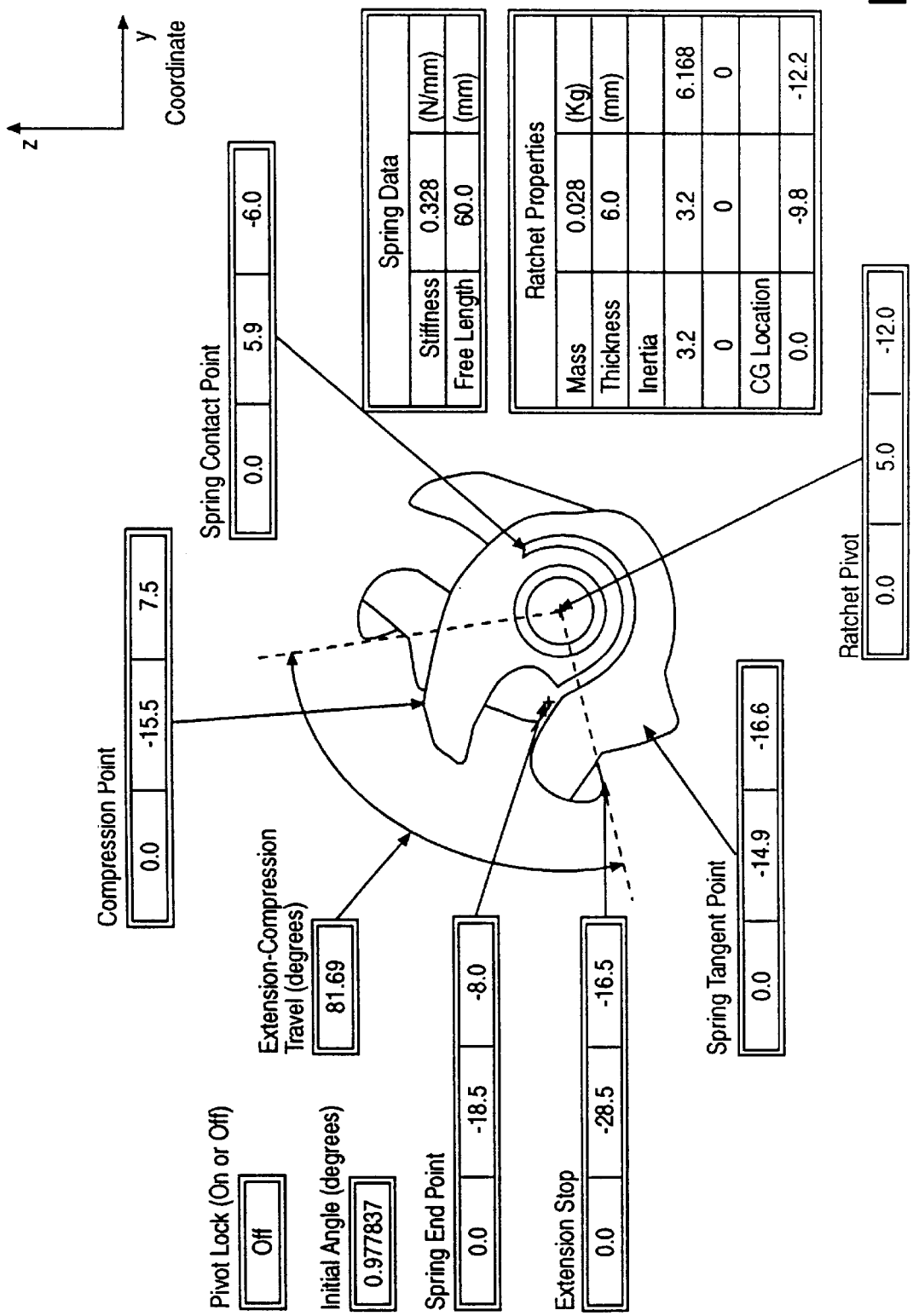
Figure 5C:
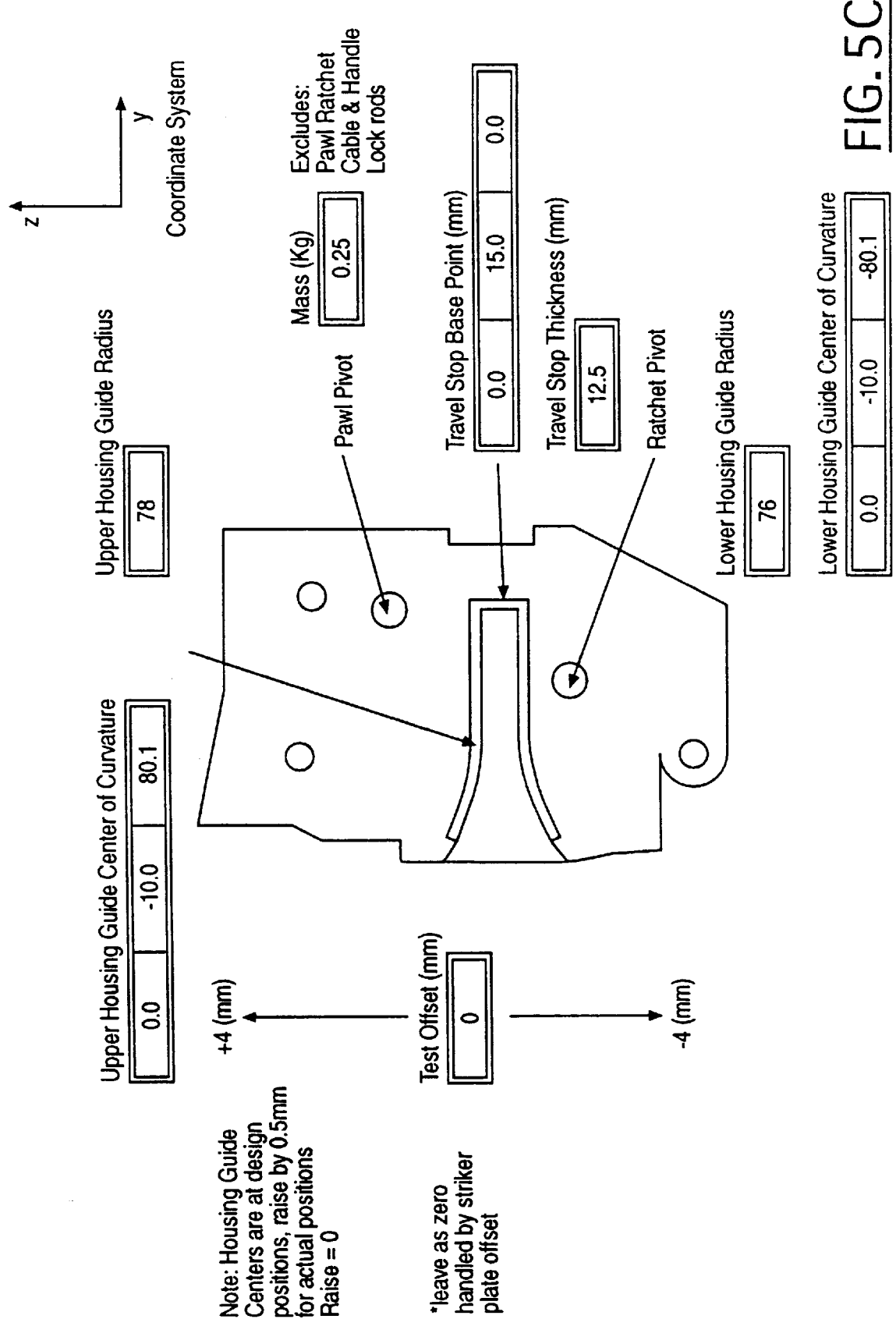
Figure 5D:
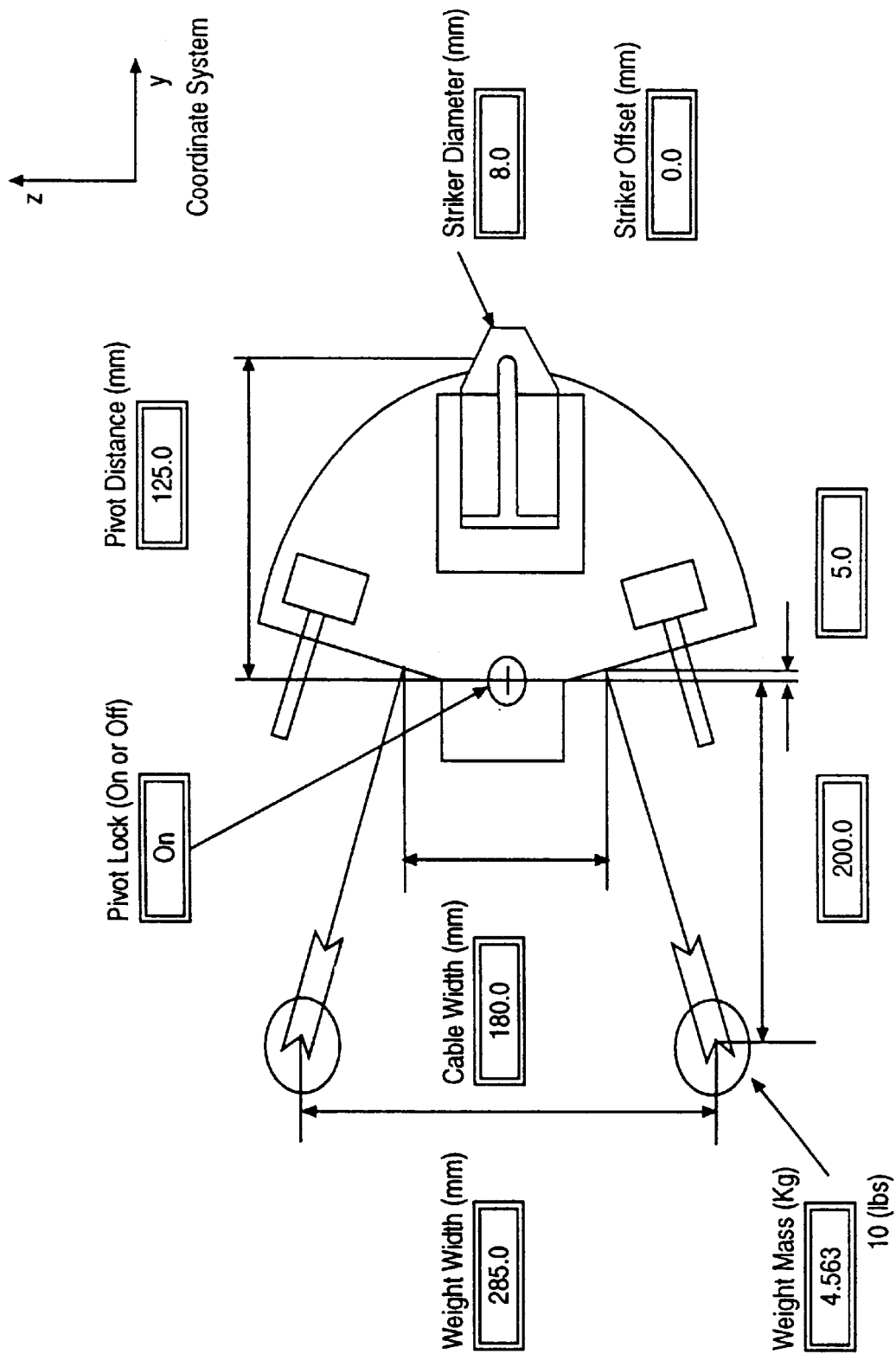
Figure 5E:
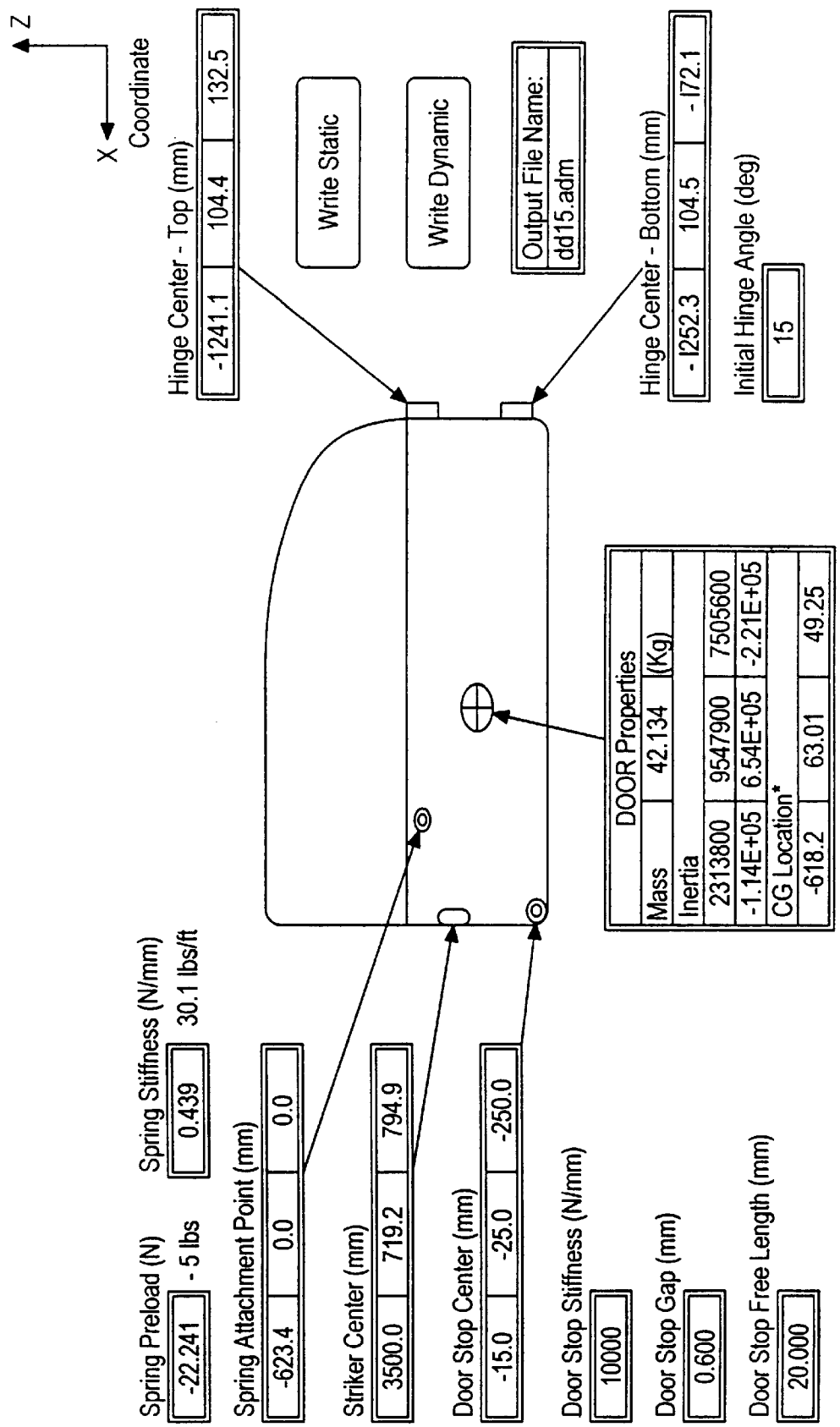

In the present invention, a latch mechanism can be designed from scratch or an existing design can be modified. As seen in FIG. 4, a screen has buttons for various latch components, including a pawl 32, a ratchet 34, a housing 36, and a striker 38, respectively. Upon selecting a latch component, a separate screen is provided to allow input of various component specifications for the pawl, ratchet, housing and striker, as seen in FIGS. 5A–5D, respectively. In the main latch design screen of FIG. 4 is also a Latch Test button 40 which provides a simulation of an actual latch test used on physical latches. The latch test typically involves mounting latch hardware to a test fixture which consists of a translating sled mechanism and weights. The minimum force to close and fully engage the latch statically and the minimum energy to dynamically close the latch are obtained from this test. Ratchet and pawl spring stiffness profiles can also be changed to modify the door system static closing force and energy, as seen in FIG. 5E, which is a screen showing the door test button 42 of FIG. 4. Door latch parameters may be put into a modeling program, such as a spreadsheet, and a new latch model generated. The new latch model can then be "virtually tested" in the Latch Test, and velocity, acceleration, force and energy time histories generated, as shown in FIGS. 6A–6D, respectively. These time histories can then be evaluated by a designer and the design modified interactively to develop new latch designs without building and testing prototype hardware.

Door Closing and Slam

The dynamic resistance to door closing and slam of the air within the passenger compartment and within the seal bulbs can be characterized by the present invention. Air extractor area for the body and vent hole size and spacing for the weatherstrip seals are selected and the door model is assembled, a closing or slam analysis is conducted, the results are evaluated, and, if necessary, modifications can be made to produce the desired effect on closing effort or slam loads. All this can be done by changing predefined closing effort parameters, such as the air extractor area and vent hold size and spacing.

Seal Design

Figure 7A:
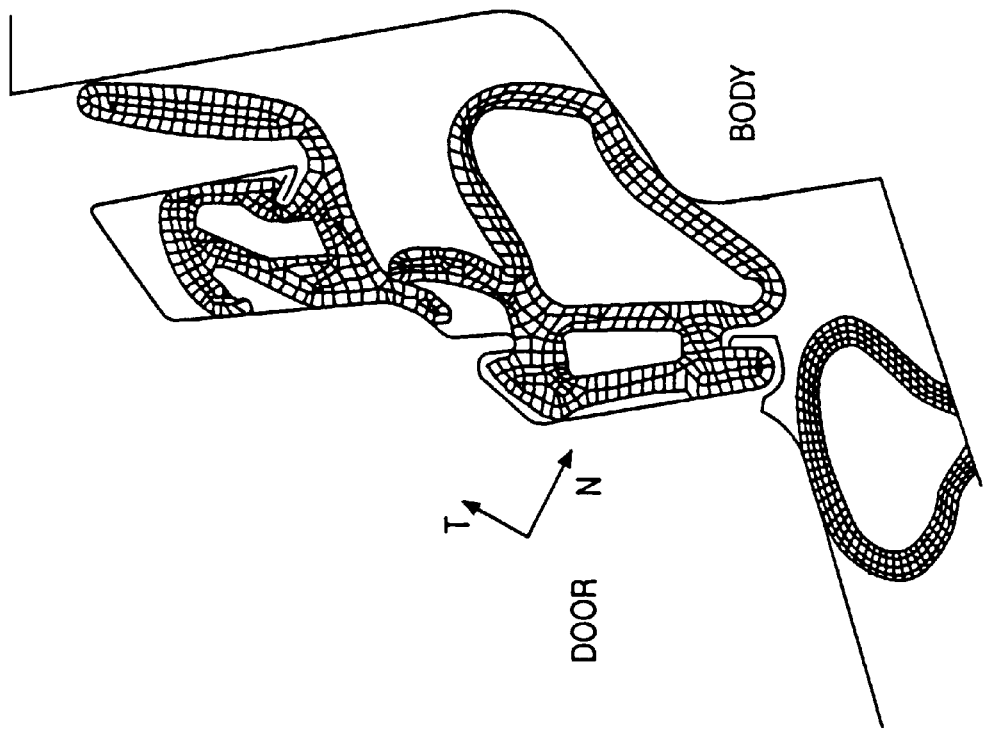
FIGS. 7A–7B show cross-sectional views of an initial position and a design compression configuration, respectively, for a door seal which can be modeled with the method and system of the present invention.
Figure 7B:
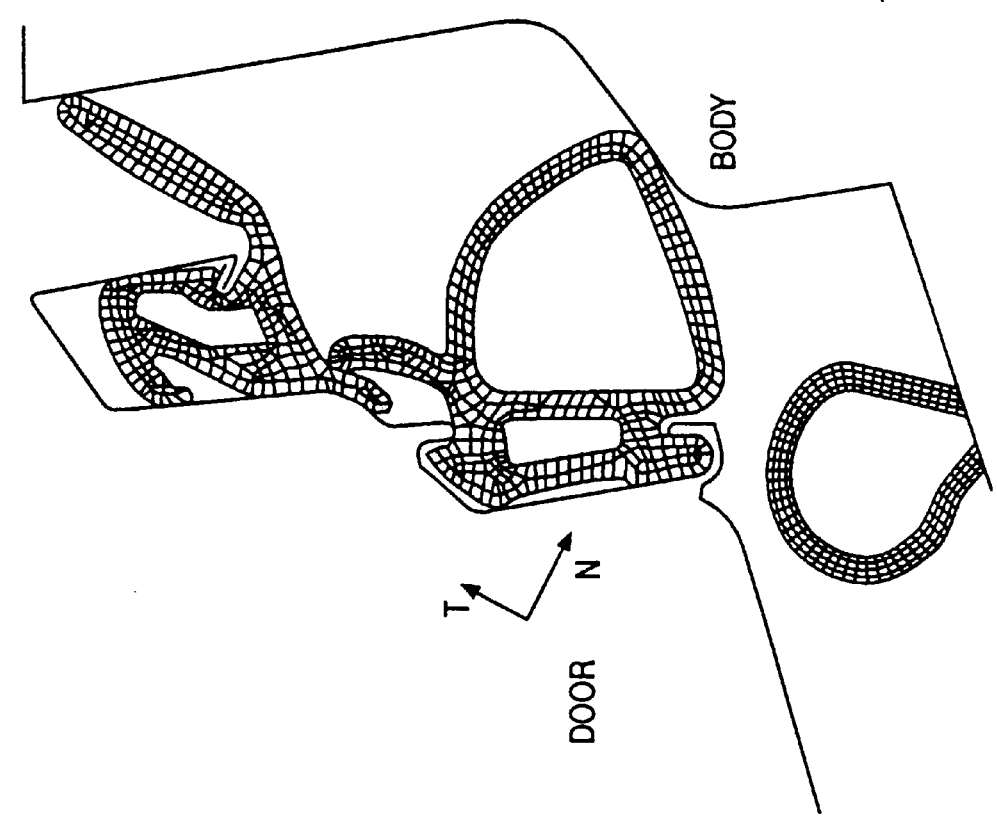

Weatherstrip seal resistance to door closing and slam can be characterized by the present invention. The effect of alternative seal designs on door closing effort and slam loads can be investigated by modifying an initial seal geometry in a finite element analysis. FIGS. 7A and 7B show a sample model a finite element mesh for a seal in an uncompressed state and a compressed state, respectively. Further analysis can determine whether the seal modifications had a desired effect on closing effort and slam loads. In a first stage of such an analysis, data defining the seal and door geometry in two-dimensional surfaces are used to create a finite element model from the geometric surfaces. The boundary conditions are the translations and rotations of the door in simulating door closing. Material properties for the seal, such as a dense rubber skin on the outer surface and a sponge rubber for the inner core, are used for the seal model. CLD curves of the seal model are then determined, as are the deformed and undeformed seal shapes, as seen in FIGS. 7A–7B.

The seal model for the present invention includes the effects of nonlinear elastic compression load deflection (CLD) resistance, the nonlinear damping resistance due to air flow out from the seal bulb vent holes and the effects of build variations. The information for the seal CLD models can be generated by nonlinear finite element analysis. This information is multiplied by appropriate lengths to model the seal responses around the door perimeter. Nonlinear finite element codes or a detailed test program could also be used to obtain the basis information for the seal models.

Figure 8:
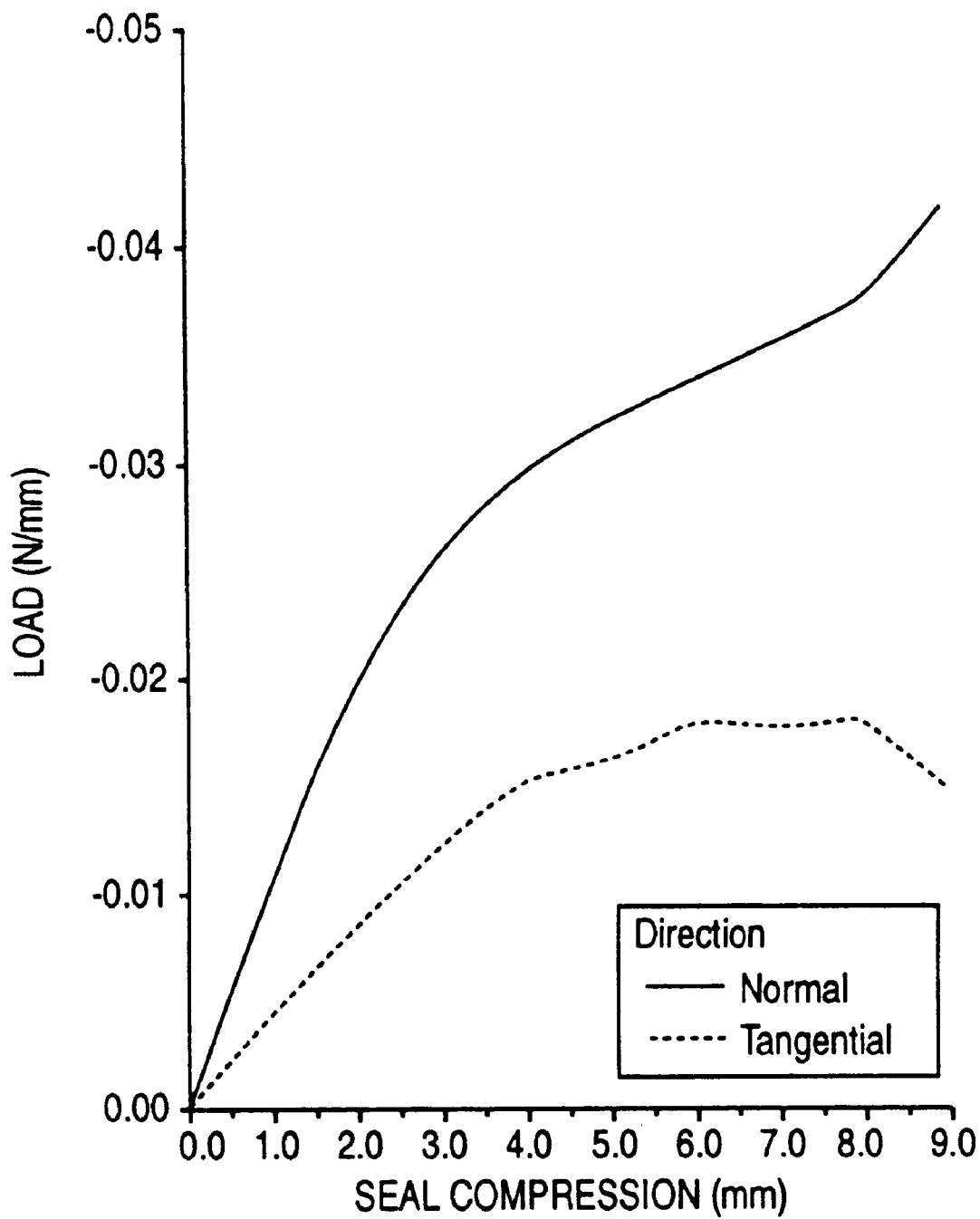
FIG. 8 is a graph showing a compression load deflection (CLD) of a primary cut line and secondary seal along a front door A-pillar above the belt line for an automotive vehicle door for modeling a door seal in the present invention.

The CLD resistance of the seals is preferably modeled as nonlinear elastic springs within the present invention. FIG. 8 shows a calculated CLD response of the cut line plus primary seal for the seal model of a front door seal system for the A-pillar above the belt line. A zero deflection position is defined herein as the position when the first seal touches the mating sheet metal. FIGS. 7A–7B show the zero position and the design compression position, respectively, for the A-pillar seal section above the belt line. FIGS. 7A–7B also show the normal (N) and tangential (T) local coordinate system for the seal CLD model. The curve from FIG. 8 and similar curves for various seal sections around the door perimeter and for various tangential offsets (that model door build variations) are included in the present invention to model the seal nonlinear elastic closing resistance. A CLD response is incorporated into the present invention with a force model having nonzero components in the direction of door closing and tangential to the direction of door closing. The force components are preferably obtained through a force function and the local computed seal gap between the door and body side. Preferably, a spline response surface is generated at consistent compression distances for all the build variations.

The weatherstrip seals are closed bulb and have periodic vent holes that allow air to escape. The air escaping from the seals offers a nonlinear damping resistance force to seal compression, which is a three-dimensional nonlinear damping model. The seal air damping model explicitly includes the effects of seal vent hole diameter and spacing on the damping force. The damping model is based on first principles, the application of mass and momentum balance equations to a control volume of a section of seal including period vent holes. The seal control volume is idealized as a rectangular tube of decreasing internal volume. The seal nonlinear damping force per unit seal length due to the flow of air through the ventilation holes is, $$F_d = \frac{F}{L} = \frac{\rho W L^2}{24}\left[\left(\frac{192}{\pi^2}h^2\frac{W^2}{D^4} - 1\right)\left(\frac{\dot{W}^2}{w^2} + \frac{\dot{h}^2}{h^2}\right) + \left(\frac{384}{\pi^2}h^2\frac{W^2}{D^4} - 1\right)\dot{W}\frac{\dot{h}}{Wh}\right]\text{sgn}(\dot{h}) \quad (1)$$

where:

$F_d$=seal nonlinear damping force per unit length
F=force due to air damping
L=ventilation hole spacing
$\rho$=density of air
W=A/h=average seal width
A=area of seal cross section
h=average height of seal
D=ventilation hole diameter
sgn(X)=function that returns the sign (positive or negative) of the argument $$\dot{W} = \frac{h\left(\frac{\dot{A}}{h} - \frac{A}{h}\right)}{h} = \text{velocity of average seal width}$$

$\dot{h}$ = velocity of seal height $\dot{A}$ = velocity of seal cross sectional area The nonlinear air damping model expressed in the above equation is preferably implemented in the present invention by calculating the damping resistance force as a function of the current seal geometry and the input parameters of vent hole diameter and spacing. After the vent hole parameters are defined, the current values of the state variables, the seal internal area and characteristic height, are obtained from equations that define these variables as functions of seal compression. Other state variables, including the velocities of the characteristic seal width and height, can be obtained from implicit differential equations that calculate the time derivatives of the variable.

The seal models include the effects of door build variations. The requisite data for the seal CLD model and the air damping model are obtained at over- and under-compression as well as various tangential offsets to describe build variations. The inboard/outboard build variations are accommodated by over- or under-compression along the normal (closing) direction. The effects of door high/low and fore/aft build variations are accommodated by obtaining CLD and seal internal geometry information (for damping model) at various tangential offset positions. For example, for any seal along the rocker or roof line door build variations in the fore/aft direction does not effect seal response, only build variations high/low and inboard/outboard influence the seal response.

The resistance to door closing due to the hinge and bumper overslam can also be characterized by the present invention. The effects of hinge angle, hinge "detent" and door rotation resistance, as well as the location, stiffness and size of the overslam bumper, are factors which are varied to produce desired door system response. These factors can be changed separately, or in combination, and a new door model rebuilt. A door closing analysis is then again performed to determine the closing effort and velocity, as seen in FIGS. 6A–6B, and results are reevaluated to ascertain if the proposed design changes improved the door system performance.

In addition to the Door Latch Test Stand described above, the present invention simulates a battery of tests typically performed on vehicle door system prototypes to determine relevant design alteration information. These tests include, for example:

closing effort test (spring controlled);

closing velocity test (velocity controlled);

slamming loads for durability (spring energy controlled);

slamming loads for durability (initial velocity controlled);

door deflections due to aerodynamic loading; and door system natural frequencies.

These tests, which are implemented in the present invention to provide virtual testing of a prototype door system as described below, preferably include the effects of build variations on the system response. In addition, the effects of B-pillar or A-pillar structural stiffness, which may play a role in door slamming deflection due to aerodynamic suction, and natural frequency, may also be included.

Force Controlled Latch Closing Test

The door latch test determines the minimum force required to fully engage the latch. The test stand uses hanging weights to drive the latch into a rigidly mounted striker. This analysis examines only the latch whereas all the other analyses include the complete door system. Time history results from all the components as well as the final state of the door system can be generated and displayed, and latch parameters varied to achieve a desired result. These parameters can include hinge torque, seal resistance forces, air pressure in the cabin, and other component models described below.

Spring Controlled Closing Test

Preferably, the model includes a full door system and a pretensioned door closing spring, set with a closing force appropriate for the purpose, for example 22 Newtons. The spring force can take other values as required for the particular door design. All relevant geometry to describe the system is modeled, including door stiffness, mass geometry, trim parts, seals, hinge, latch, bumper, and body information as shown in FIG. 2. Most importantly, the hinge angle must be specified in the door system design at the beginning of the test. The analysis results include two key parameters, spring force at the instant the hinge constraint is released and the final state of the latch (fully engaged, partially engaged or not engaged). Increasing the hinge open angle, increases the force in closing spring. The analysis is typically repeated a number of times to refine the predicted spring force (and energy) required to fully engage the latch.

Velocity Controlled Closing Test

A controlled velocity test can be performed which includes the full door system subjected to a prescribed initial velocity. The analysis input includes all the door system attributes plus the hinge rotational velocity from approximately 15° open until 3.5° open. From this position, the door is free to latch (or not) based on the system energy. The analysis results include two key parameters, the velocity of the door edge near the latch when it is 25 mm away from flush and the final state of the latch (fully engaged, partially engaged or not engaged). Increasing the initial hinge rotation velocity increases the door edge velocity at 25 mm. The analysis is preferably repeated a number of times to refine the predicted closing velocity (defined as the door edge velocity at 25 mm away from flush) required to just fully engage the latch. After each iteration, the predicted closing velocity is displayed and a design change can be made interactively, for example input through a computer keyboard, to prepare for a subsequent iteration.

A closing effort curve plotting door closing force vs. door closing velocity can be obtained and displayed on a computer monitor from the method and system of the present invention. Such a curve provides important system level information before hardware prototypes are available. The results from the spring controlled closing effort test and the velocity controlled closing test are considered together as one data point on the force vs. velocity plot that characterizes door closing effort, as shown in FIG. 3. By considering different door build conditions, seal responses and other variables, and repeating the two sets of analyses described above, additional points on the velocity vs. force plot can be generated that envelope the predicted door system response without prototype hardware. This envelope thus enables a designer to verify that the door meets design criteria fo the range of likely manufacturing variations (FIG. 3).

An additional advantageous feature of the present invention is the ability to easily simulate teardown tests by simply switching off various component models. For example, if the internal cabin pressure model is not active, door closing simulation mimic the tests that would be performed with windows down. Similarly, if either or both the primary and secondary seal forces are switched off, then door closing is simulated without the seals.

Force Controlled Slam Durability Test

A simulation of a slam durability test performed on door systems can be performed as follows. A non-pretensioned spring is attached to the door inner panel near the latch. The door is opened through an angle sufficiently large to generate a predetermined amount of potential energy. The spring stiffness is also set to a predetermined amount, for example in the range of 0.25 N/mm to 1.0 N/mm. The door system is brought to rest and then the hinge rotational constraint is released. The door slams shut under the spring's energy transfer to the door system. Time traces, or time histories, of position, velocity and acceleration for desired points within the door system as well as force time traces for critical components. The generated histories and/or peak responses can be used in later durability analyses to predict sheet metal failures.

Velocity Controlled Slam Durability Test

This analysis parallels the force controlled slam durability test but uses a constant velocity input rather than the spring potential energy to slam the door. In this test, the door is closed under the application of a constant rear edge velocity magnitude from a position of approximately 15° open until 3.5° open. At 3.5° the door is released and free to slam under it own energy. As in the previous analysis, time histories are generated that can be used for later sheet metal durability analyses. FIGS. 6A–6D show the results of a slam analysis. The velocity and acceleration of the latch and the force, energy and power on the striker are readily obtained and displayed.

Figure 9:
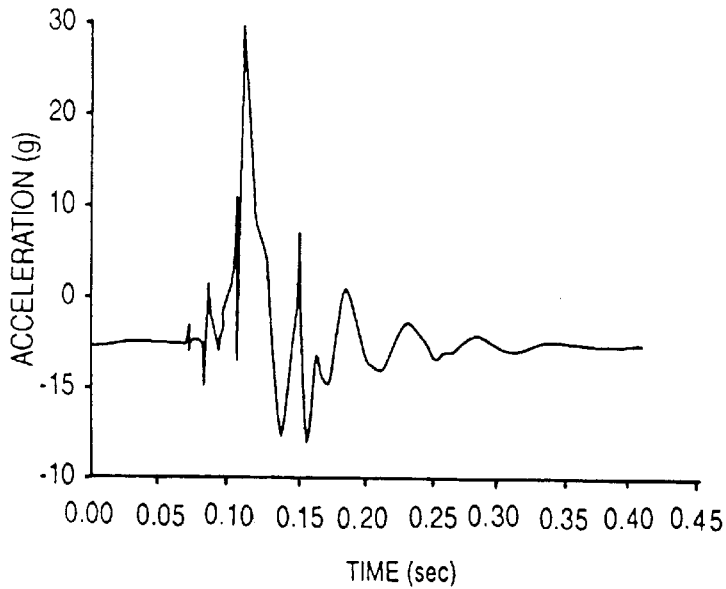
FIG. 9 is a graph showing door acceleration history generated by the method and system of the present invention.

The generation of slamming loads for later durability analysis is a novel capability of the present invention. Using a flexible representation of the door structure, time histories of position, velocity and acceleration for any point of interest on the door system can be generated. These time histories and/or peak responses can be used in standard durability analyses. As an example, the acceleration time history of FIG. 9 can be applied to a door structure and a resulting stress and strain time history (not shown) can be analyzed against a stress or strain life durability capacity for the sheet metal components. Alternatively, a peak acceleration range from FIG. 9 can be applied as resultant forces and a peak stress range compared to a stress life (S/N) curve (not shown) for sheet metal comprising the door system.

Deflections Due to Aerodynamic Loads

Door deflection due to aerodynamic load can be important at highway or autobahn speeds when the suction loads reach high levels. Since the suction load increases with the square of vehicle speed, and linear elastic door response is assumed, the door deflection increases as the vehicle speed squared. It is important to recognize that deflection due to aerodynamic loads can reach levels which may impact seal system robustness. The deflection due to aerodynamic suction reduces the seal system's resistance to seal aspiration.

Door deflections due to aerodynamic loading can be determined with the present invention. The aerodynamic loads are applied as point loads at predetermined locations, for example at approximately 30 locations in a flexible door model. The input includes the tributary areas assigned to each point load location on the exterior of the door, the direction cosines of the representative outward unit normal vector from the door surface at each point load location, and the area weighted average of the coefficient of static pressure, cp, assigned to each point load location. A static analysis is performed of the latched door subjected to the point loads representing the distributed aerodynamic suction load. Output for design modification purposes includes the displacement of all the load points on the exterior of the door and the seal compression accounting for aerodynamic suction and any prescribed build variation.

The method of the present invention can predict door system deflection due to aerodynamic loading on the door. This is preferably done in conjunction with a static coefficient of pressure, cp, distribution for the door exterior which can be obtained from either wind tunnel testing or computational fluid dynamics calculations. This loading and associated door deflection increases approximately proportionally with the square of the vehicle velocity. At highway and autobahn speeds, the resulting door deflection can be great enough to be a concern for dynamic weatherstrip sealing.

Door System Natural Frequencies

Another door system characteristic, the natural frequencies of the door system in the latched configuration, can be determined with the present invention, with or without the influence of aerodynamic loading. This information can be used to evaluate the door system design against NVH (noise, vibration, and harshness) targets. The natural frequencies of the latched door system are preferably determined by computational eigenvalue extraction techniques using the stiffness and mass models of the door system, accounting for the seal, latch, and bumper stiffness, as well as any aerodynamic loading. It is believed that the influence of aerodynamic loading has no significant effect on the natural frequencies of the latched door.

Natural frequencies and mode shapes of the door in the latched and sealed position are generated with or without the influence of the aerodynamic loading. This information provides important insight into the door system's dynamic behavior at any build variation and operating speed. The analysis begins with closing a door model under velocity or spring control, then applying aerodynamic loads, if desired, and finally determining a full eigen solution of natural frequencies and mode shapes. The full eigen solution can be obtained from computer sources known to those skilled in the art, such as an ADAMS solver, or another like program.

The present invention provides much of the information required to evaluate door designs for function and durability without relying on prototype hardware testing. Model construction can start at wireframe freeze and be based on the information finalized at that point of the program. The method of the present invention should then be utilized with the maximum, nominal and minimum seal gap positions to validate the expected closing effort range. Additionally, a door slam analysis of the present invention can be performed at 10 ft-lb. spring energy with the door in the nominal seal gap position to determine the slam loads for the finite element durability model and analyses.

To provide the analysis capabilities described above, the present invention has a number of features that depict the overall door system. These features model the various components of the door system.

Rigid Door Model

The rigid door model accounts for the total mass of the door as a single point mass located at the door's center of gravity. Using this model implies the assumption that the description of the motion of all points on the door can be adequately characterized by the motion of the center of mass. This door model is adequate for closing effort and velocity simulations, but is not consistent with the basic assumptions for the other analyses.

Flexible Door Model

The flexible door model accounts for the door's distributed structural stiffness and mass. The model uses a special version (superelement) of the finite element stiffness and mass matrices to describe the door with point masses interconnected by a multipoint force element which establishes linear force vs. displacement (stiffness) and force vs. velocity (damping) relationships between these masses. This model permits modeling door vibrations and deflections. This flexible door model is required for the slam simulations (force or velocity controlled) plus the aerodynamic deflection prediction and the natural frequency calculation.

Concentrated Masses

The concentrated masses for hardware and trim models are preferably used in conjunction with the flexible door model to accurately represent the mass distribution within the door. The major hardware and trim components such as the window regulator, the power lock motor, the speakers etc. are identified as point concentrated masses. Each of these masses are connected to one of the points describing the flexible door structure. The masses are included in the present invention with markers assigned to each of the concentrated masses, which are then connected to an appropriate door part with either a rigid connection, a pinned joint with three fixed translation degrees of freedom and three open rotational degrees of freedom, or an elastic bushing with three translational and three rotational bushing (spring) rates.

Hinge Model with Detents

The present invention models the hinge as a single degree of freedom rotational joint with a resisting torque. The model requires the location of the center of the pin for the top and bottom hinges in global body X, Y, Z coordinates. This information is required to set the door slope inboard/outboard and fore/aft. Additionally, to model the detents (door checks), the resisting torque vs. hinge angle information must be available for door opening and closing. The door detent response is included in the present invention with references to a description of the torque vs. hinge angle for door opening or closing.

Overslam Bumper Model

The overslam bumper simulates the hard rubber stop for the door. For example, this bumper can be located near the latch and is not engaged (1.0 mm clearance) when the door is in the fully latched design position. The present invention includes the overslam bumper as a nonlinear force acting at the prescribed location and direction. The overslam bumper is incorporated as a local Z direction force which can be obtained from a load vs. deflection curve for the rubber stop.

Latch

The latch model includes the ratchet, pawl, housing guide with fishmouth, striker, all the springs and bumpers. The model includes friction between the striker and the ratchet, the ratchet and the pawl, the striker and the housing guide, the ratchet about its pivot and the pawl about its pivot. Friction is included as a Coulomb model with friction coefficient set to 0.10.

The present invention models the latch in an arbitrary position and orientation and includes the locations of the striker and the centers of the top and bottom hinge pins expressed in global body X, Y and Z coordinates.

Closing Spring Model

The model for the spring that supplies closing energy to the door in either the closing effort or door slam simulation is modeled as directly attached to the door at a specific location with a prescribed stiffness, damping and preload. The present invention connects the spring from the input location on the door to the mirror location on the opposite door.

Internal Cabin Air Pressure Resistance

Closing a vehicle door with all the windows closed creates a temporary pressure increase within the passenger compartment. The interior air pressure resistance can account for approximately 30% of the total door closing effort. A cabin pressure model based on the conservation of mass within a control volume has been incorporated into the present invention. The cabin pressure model has been implemented through a user defined differential equations.

Figure 10:
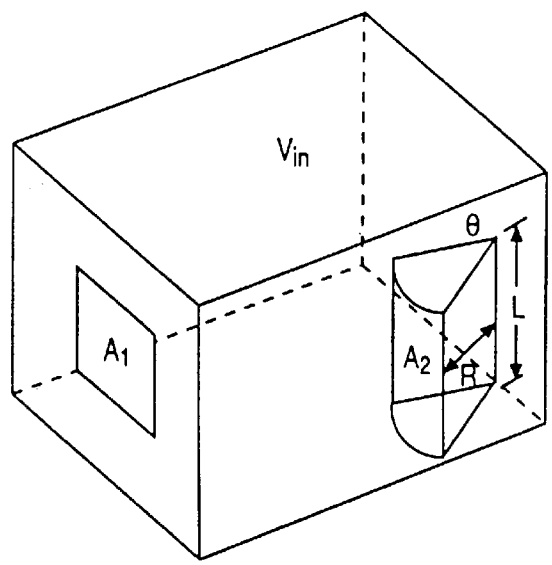
FIG. 10 is a perspective view of a control volume demonstrating determination of an automobile passenger compartment air pressure resistance determination.

The analytical model is based on the control volume depicted in FIG. 10. The area $A_1$ is the total of the design air extractors and the body leakage. The volume Vin is the total cabin volume (typically including the trunk). The area A2 is the area the closing door perimeter makes with the body side. The distances R and L are the characteristic door radius and door height respectively. The angle q is the door hinge opening angle. Using this model the cabin air pressure model depends on the vehicle interior volume, the air extractor plus equivalent cabin leakage area, the average height and width of the door, the door closing angle and the door closing angular velocity.

The governing equations for the simple model are as follows. For the conservation of mass within the control volume:

$$\frac{d(\rho V)}{dt} = -\sum \rho v_e A_e \quad (2)$$

where:
 $\rho$=density of air,
 V=volume in control volume,
 $v_e$=exit velocity,
 $A_e$=exit area,
 t=time,
 $\Sigma$=summation over all the exits considered.

Using the assumptions that the isentropic relationship between pressure and density, inviscid flow and the two exit areas exhaust to atmospheric conditions all are reasonable for this case permits writing the time derivative of pressure within the vehicle with respect to pressure, volume and area as, $$\frac{dp}{dt} = \frac{-7}{5} \frac{C_1^{(5/7)}}{V} \left[ \rho_{atm}(A_1 + A_2) K p^{(2/7)} \sqrt{p - p_{atm}} \right] - \left( \frac{7}{5} \frac{p}{V} \frac{dV}{dt} \right) \quad (3)$$

where:

p=internal cabin pressure (Pa), assumed to be constant, t=time (sec), $C_1$=isentropic constant for air, $C_1$=(101300 Pa)/(1.225 kg/m³)$^{1.4}$, V=volume in control volume (m³) from FIG. 10, V=$V_{in}$+ LR²θ/2

L=representative door height (m), see FIG. 10,

R=representative door radius(m), see FIG. 10,

θ=door hinge angle (rad), see FIG. 10, $V_{in}$=internal volume (m³) of the cabin, including trunk, see FIG. 10, $\rho_{atm}$=atmospheric density, 1.225 kg/m³, $A_1$=constant exit area (m²), see FIG. 10, $A_1$=$A_{leakage}$+$A_{air\ extractor}$ $A_{leakage}$=constant leakage area (m²), $A_{leakage}$=Q×2.3381× $10^{-5}$, Q=leakage rate (cfm) at 248.9 Pa (one inch water column), $A_{air\ extractor}$=air extractor area (m²), $A_2$=area between closing door and body, see FIG. 10, $A_2$=R(L+R)θ, $K$ = flow coefficient, $K = \sqrt{2/\rho_{atm}} = 1.2278\ m^{3/2}/kg^{1/2}$, $p_{atm}$ = atmospheric pressure, 101300 Pa, $\frac{dV}{dt} = \frac{LR^2}{2} \frac{d\theta}{dt}$.

Equation (3) is the differential equation included in the present invention with a user defined differential equation option. The equation is subjected to the following conditions, if dθ/dt≧0, (door opening or stationary) then p=$p_{atm}$, if dθ/dt<0, (door closing) and θ≧0.25 rad then p=$p_{atm}$, if the door begins closing at time $t_1$ and θ<0.25 rad at $t_1$ then at time $t_1$, p=$p_{atm}$ Aerodynamic Loading Model At highway and autobahn speeds the aerodynamic suction force causes the door to deflect outwards. This deflection reduces the seal compression and in extreme cases can increase the wind noise at the driver's and/or passenger's ear. The door deflection can be in the range of a few millimeters and therefore must be included in the overall door system design and dynamic sealing considerations.

The present invention includes the aerodynamic suction loads as discrete point loads, acting on points associated with the door exterior. Point loads are created from the vehicle velocity, the locations of the exterior door points, their associated areas and outward unit normals and their area weighted average the static coefficient of pressure, cp. The static coefficient of pressure is defined as, $$c_p = \frac{p - p_\infty}{\frac{1}{2}\rho U_\infty^2} \quad (4)$$

where:
- $c_p$=static coefficient of pressure,
- p=local pressure,
- $p_\infty$=far field, steady pressure in the free stream,
- $\rho$=density of fluid, air,
- $U_\infty$=far field, free stream fluid velocity.

Thus, the static coefficient of pressure, also called simply the pressure coefficient, is the nondimensional parameter defining the static pressure on the door exterior. The pressure coefficient distribution on the door can be obtained from wind tunnel experiments or from computational fluid dynamics (CFD) analyses. The area weighted average cp, the area and local outward unit normal must be obtained from the door geometry, the DSM door discretization and the cp distribution.

Suspension Characteristics

The present invention includes the option of modeling a full body on suspension to simulate the compliance of the body plus suspension for the door closing and slamming analyses. The body is modeled as a single rigid point mass located at the center of mass of the full vehicle. The suspension and tires are modeled at the spindle locations.

Figure 11:
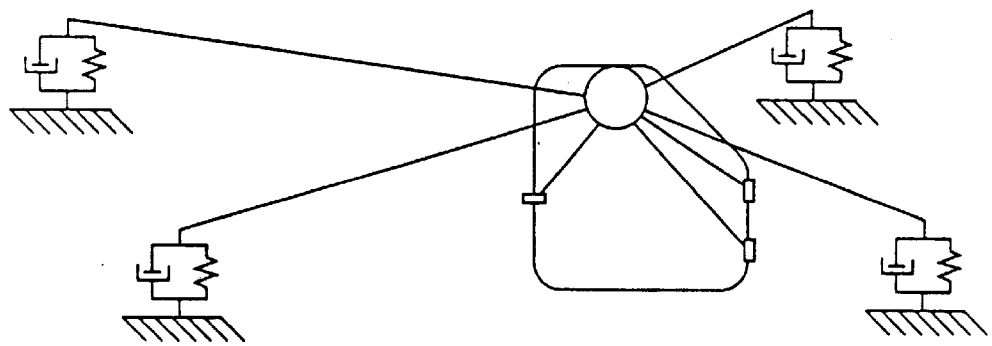
FIG. 11 is schematic diagram of a vehicle model, represented by a single concentrated mass supported on four sets of springs and dashpots representing the tires and suspension, connected to a rigid door opening, with a latch striker and hinges.

The body side of the hinges, door opening panel and striker are all connected to the single part rigid body vehicle model. The single part, rigid body vehicle model is connected to the rigid ground via four sets of tridirectional spring dampers representing the vehicle suspension and tires. These translational bushings mimic the vertical (up/down), lateral (right/left) and longitudinal (front/rear) stiffness and damping of the suspension and tire systems. The single rigid body that defines the vehicle has all the vehicle mass acting at the center of gravity location. FIG. 11 depicts a single part, rigid body vehicle model.

The method of the present invention is preferably accomplished on a computer system to provide interactive display of parameter time histories which describe all major door components in an analytical prototype of a vehicle door system. The tool can utilize commercial and/or custom software tools to create and exercise a virtual prototype of a door system, while displaying information pertinent to door redesign to meet predetermined door system criteria. In a preferred embodiment, the system can be run on an engineering workstation, such as SUN and HP workstations. Those skilled in the art will recognize that other workstations or computer systems may also be utilized.

Although the preferred embodiment of the present invention has been disclosed, various changes and modifications may be made without departing from the scope of the invention as set forth in the appended claims.

What is claimed is:

1. A method for designing a door system for an automotive vehicle, the method comprising the steps of:
   (a) storing in a memory of a computer system a first set of data representing a door geometry;
   (b) storing in the memory a second set of data representing the mass and inertial properties of the door system;
   (c) storing in the memory a third set of data representing a weatherstrip seal system static and dynamic response behavior;
   (d) storing in the memory a fourth set of data representing a door system compliance;
   (e) storing in the memory a fifth set of data for determining a closing effort for the door system;
   (f) storing into the memory a sixth set of data representing a door system hardware physical response behavior;
   (g) determining whether a door latch of the door system fully engages and remains engaged after the door system has been imparted with an initial velocity from a predetermined initial, opened angular position based on the first, second, third, fourth, fifth, and sixth sets of data and upon a set of dynamic motion equations for the door system;
   (h) displaying time histories of predefined parameters of the door system, door related hardware, and vehicle passenger compartment, such parameters acceleration, velocity and position of any point on the door structure, angular acceleration, angular velocity, and angular position of pawl and ratchet components of a latch mechanism, pressure build-up in the passenger compartment, forces acting on a door striker, and component reaction forces;
   (i) comparing the time histories to predetermined door system design criteria;
   (j) changing the door system design by modifying the first through sixth sets of data if the time histories do not meet the design criteria; and
   (k) redoing steps (g) through (j) until the door system performance meets the design criteria.

2. A method according to claim 1 wherein the first set of data includes a door swing geometry and deviations therefrom, and a geometry detailing a position of a seal mating surface and of attachment surfaces.

3. A method according to claim 1 wherein the second set of data includes a mass and inertial properties of appurtenances on the door system.

4. A method according to claim 1 wherein the third set of data includes a weatherstrip seal system static compression load deflection (CLD) response behavior, a seal statically deformed shape, and seal system ventilation hole diameter and spacing.

5. A method according to claim 1 wherein the fifth set of data includes the full vehicle mass and suspension compliance properties, the volume of the passenger compartment, and cross-sectional areas of the air extractors and body leakage areas.

6. A method according to claim 1 wherein the sixth set of data includes a hinge moment versus resistance curve, inertia, spring rate and frictional characteristics of latch components, and a door overslam bumper CLD behavior.

7. A method according to claim 1 wherein a seventh set of data is stored in the memory representing an aerodynamic pressure load which acts on the door system when the vehicle is being driven at different speeds and different vehicle yaw angles and is included in step (g).

8. A method according to claim 7 wherein a set of data representing door system deflections due to an applied aerodynamic loading is computed based upon the first, second, third, fourth, fifth, sixth, and seventh sets of data.

9. A method according to claim 1 wherein an eighth set of data representing natural vibrational frequencies and mode shapes of the door system are computed based on the first, second, third, fourth, fifth, and sixth sets of data, wherein the eighth set of data is included in step (g) and displayed in step (h).

10. A method for designing a door system for an automotive vehicle, the method comprising the steps of:

(a) selecting a door system design;

(b) generating a set of door system data describing attributes of a door opening panel (DOP), mating surfaces of the DOP and the vehicle, vehicle attributes, door structure attributes, hardware attributes, and seal system attributes;

(c) generating a door system model from the door system data;

(d) selecting a design criteria for the door system;

(e) determining a door system performance under predetermined conditions based upon the door system model by computing and displaying time histories of predefined parameters of the door system, door related hardware, and vehicle passenger compartment;

(f) comparing the door system performance to the design criteria;

(g) changing the door system design by modifying the set of door system data if the door system performance does not meet the design criteria; and (h) redoing steps (b) through (g) until the door system performance meets the design criteria.

11. A method according to claim 10 wherein the time histories of the predefined parameters include:

a time history of acceleration, velocity and position of any point on the door system;

a time history of angular acceleration, angular velocity, and angular position of pawl and ratchet components of a latch mechanism;

a time history of pressure build-up in the passenger compartment;

a time history of forces acting on a door striker; and component reaction force time histories.

12. A method according to claim 10 wherein the predetermined conditions include an initial velocity for the door from an initial, opened angular position of the door.

13. A method according to claim 10 wherein the door system data includes aerodynamic loading data.

14. A method according to claim 10 wherein the door system data includes door system test data.

* * * * *